United States Patent
Shih et al.

(10) Patent No.: US 7,541,217 B1
(45) Date of Patent: Jun. 2, 2009

(54) STACKED CHIP STRUCTURE AND FABRICATION METHOD THEREOF

(75) Inventors: Ying-Ching Shih, Changhua County (TW); Shu-Ming Chang, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/198,072

(22) Filed: Aug. 25, 2008

(30) Foreign Application Priority Data

Feb. 5, 2008 (TW) .............................. 97104601 A

(51) Int. Cl.
*H01L 21/44* (2006.01)
(52) U.S. Cl. ................ 438/109; 257/777; 257/E23.085
(58) Field of Classification Search ................ 438/109, 438/612, 613; 257/686, 698, 737, 759, 777, 257/E23.085; 361/790
See application file for complete search history.

(56) References Cited

U.S. PATENT DOCUMENTS 7,151,009 B2    12/2006    Kim et al.
2008/0073741 A1*    3/2008    Apanius et al. ............. 257/434

\* cited by examiner

*Primary Examiner*—Quoc D Hoang
(74) *Attorney, Agent, or Firm*—Jianq Chyun IP Office

(57) ABSTRACT

A fabrication method of a stacked chip structure is provided. Firstly, a first conductive layer is formed on a first surface of a wafer. Afterwards, a first patterned polymer layer is formed on the first conductive layer, and a second patterned polymer layer is formed on a second surface of the wafer. Next, a second conductive layer is electroplated on the first conductive layer and is heated to form a number of solder bumps. After that, the wafers are stacked on a substrate structure. The first patterned polymer layer disposed on a first wafer of the wafers is correspondingly connected to the second patterned polymer layer on a second wafer of the wafers. The present invention is suitable for the stacked chip structure connected by the fine-pitch solder bumps. Besides, the fabrication of the present invention is relatively simplified.

13 Claims, 7 Drawing Sheets

STACKED CHIP STRUCTURE AND FABRICATION METHOD THEREOF

CROSS-REFERENCE TO RELATED APPLICATION

This application claims the priority benefit of Taiwan application serial no. 97104601, filed on Feb. 5, 2008. The entirety of the above-mentioned patent application is hereby incorporated by reference herein and made a part of this specification.

BACKGROUND OF THE INVENTION

1. Field of the Invention

The present invention relates to a semiconductor structure and a fabrication method thereof. More particularly, the present invention relates to a stacked chip structure having patterned polymer layers and a fabrication method of the stacked chip structure.

2. Description of Related Art

In modern information era, consumers continuously pursue electronic products with high speed, outstanding quality and multiple functions. The design of exterior appearances of the electronic products reveals a trend of light weight, thinness, and small size. To comply with said demand, a stacked chip structure has been developed recently. A plurality of stacked chips in the stacked chip structure is bonded and electrically connected to one another. Therefore, the stacked chip structure features a fast transmission speed, a short transmission path and favorable electric characteristics, and a size and an area of the stacked chip structure are further reduced. As a result, the stacked chip structure has been extensively applied to various kinds of electronic products and has become a mainstream product in future market.

As shown in FIG. 1, a method of forming the stacked chip structure mainly includes fabricating a via 12 at the same position on each chip 10. Besides, an electroplating process for the high-aspect-ratio via 12 is implemented to fill a conductive material 20 into the via 12, and solder bumps 30 are disposed on each of the vias 12. Moreover, the solder bumps 30 can be electrically connected to the conductive material 20 in the corresponding via 12. Next, an adhesive layer 40 is disposed on each of the chips 10. Thereafter, the chips 10 are stacked, such that each of the chips 10 can be bonded through the adhesive layer 40 of each of the chips 10. In the meantime, each of the chips 10 is connected to the conductive material 20 of the adjacent chips 10 through the solder bumps 30, so as to accomplish electrical connection between the chips 10. After that, a underfill 50 is filled between the chips 10 to protect the solder bumps 30. Herein, the method of connecting the solder bumps 30 of each of the chips 10 to the conductive material 20 of the adjacent chips 10 mostly includes heating the solder bumps 30 of each of the chips 10, such that the solder bumps 30 of each of the chips 10 are softened and thereby are connected to the conductive material 20 of the adjacent chips 10.

However, the underfill 50 is a bad conductor, thus negatively affecting heat dissipation efficacy among the chips 10. Besides, as the stacked structure is formed by stacking wafers (not shown), it is rather difficult to fill the space between the wafers with the underfill 50, and hence holes may be formed between the underfill 50 and the wafers. When air exists in the holes, a popcorn effect is apt to be induced by heating the stacked structure. In addition, the solder bumps 30 of each of the chips 10 are likely to be softened when heated, such that the heat-softened solder bumps 30 are apt to overflow onto the adjacent solder bumps 30, resulting in circuit shortage of the adjacent solder bumps 30. In addition, when an arrangement of the solder bumps 30 on the chips 10 follows the trend of fine pitch, the shortened distance between the solder bumps 30 may easily give rise to the overflow of the solder bumps 30 onto the adjacent solder bumps 30 during a heating process, which is likely to cause circuit shortage.

SUMMARY OF THE INVENTION

The present invention is directed to a stacked chip structure which features satisfactory heat dissipation efficiency and is suitable for bonding chips through fine-pitch solder bumps. Besides, bonding strength between the chips can be enhanced by means of polymer layers disposed between the chips.

The present invention is further directed to a fabrication method of a stacked chip structure. The fabrication method is adapted to bond the chips in the stacked chip structure with use of fine-pitch solder bumps. Moreover, manufacturing processes of the fabrication method are rather simplified.

In order to specifically describe the present invention, a fabrication method of a stacked chip structure is provided herein. First, a wafer is provided. The wafer has a first surface, a second surface opposite to the first surface, a plurality of first bonding pads disposed on the first surface, a plurality of second bonding pads disposed on the second surface, and a plurality of conductive structures penetrating the first surface and the second surface and electrically connected to the first bonding pads and the second bonding pads. Next, a first conductive layer is formed on the first surface of the wafer, and the first conductive layer covers the first bonding pads. Thereafter, a first patterned polymer layer is formed on the first conductive layer, and the first patterned polymer layer has a plurality of first openings for exposing the first conductive layer. After that, a second patterned polymer layer is formed on the second surface, and the second patterned polymer layer has a plurality of second openings for exposing the second bonding pads. A second conductive layer is then electroplated on the first conductive layer and is located within the first openings. Next, the second conductive layer is heated for forming a plurality of solder bumps on the first bonding pads. Meanwhile, the first conductive layer is patterned for forming a patterned first conductive layer. The patterned first conductive layer has a first portion and a second portion separated from the first portion. The first portion is disposed between the solder bump and the first bonding pad, while the second portion is disposed between the first patterned polymer layer and the wafer. Afterwards, a plurality of the wafers is stacked on a substrate structure, wherein a first wafer of the wafers is electrically connected to the second bonding pads of a second wafer through the solder bumps. In addition, the first wafer is correspondingly connected to the second patterned polymer layer on the second wafer through the first patterned polymer layer disposed on the first wafer.

A stacked chip structure is provided herein. The stacked chip structure includes a substrate structure and a plurality of chips stacked on the substrate structure. Each of the chips has a first surface and a second surface opposite to the first surface. Moreover, each of the chips includes a plurality of first bonding pads, a plurality of second bonding pads, a plurality of conductive structures, a plurality of solder bumps, a first patterned polymer layer, a second patterned polymer layer, and a patterned conductive layer. Here, the first bonding pads are disposed on the first surface, while the second bonding pads are disposed on the second surface. The conductive structures penetrate the first and the second surfaces and are electrically connected to the first bonding pads and the second bonding pads. The solder bumps are respectively disposed on the first bonding pads. The first patterned polymer layer and the second patterned polymer layer are respectively disposed on the first surface and the second surface of the chip. The first patterned polymer layer has a plurality of first openings exposing the solder bumps. The second patterned polymer layer has a plurality of second openings exposing the second bonding pads. The patterned conductive layer has a first portion and a second portion separated from the first portion. The first portion is disposed between the solder bump and the first bonding pad, while the second portion is disposed between the first patterned polymer layer and the chip. Here, a first chip of the chips is electrically connected to the second boding pads of a second chip through the solder bumps, and the first chip is correspondingly connected to the second patterned polymer layer on the second chip through the first patterned polymer layer disposed on the first chip.

To sum up, when the wafers are stacked, the wafers can be correspondingly connected to each other through the patterned polymer layers on the wafers according to the present invention. Thereby, the bonding strength between the wafers can be enhanced by means of the patterned polymer layers, and the reliability of the stacked chip structure can be further improved. Furthermore, the step of removing the patterned polymer layers after the plating process is not necessary in the present invention, while said step is required by the conventional method of fabricating the bumps. In addition, as the wafers are bonded together, the patterned polymer layers are capable of preventing the solder bumps from overflowing onto other bonding pads. As such, the present invention can be applied to the stacked chip structure in which the chips are bonded by means of the fine-pitch solder bumps.

In order to make the above and other objects, features and advantages of the present invention more comprehensible, several embodiments accompanied with figures are described in detail below.

BRIEF DESCRIPTION OF THE DRAWINGS

FIG. 3 is a top view of FIG. 2F, while FIG. 2F is a cross-sectional view taken along a sectional line I-I' in FIG. 3.

DESCRIPTION OF EMBODIMENTS

FIGS. 2A through 2H are cross-sectional flowcharts illustrating processes of fabricating a stacked chip structure according to an embodiment of the present invention.

Figure 1:
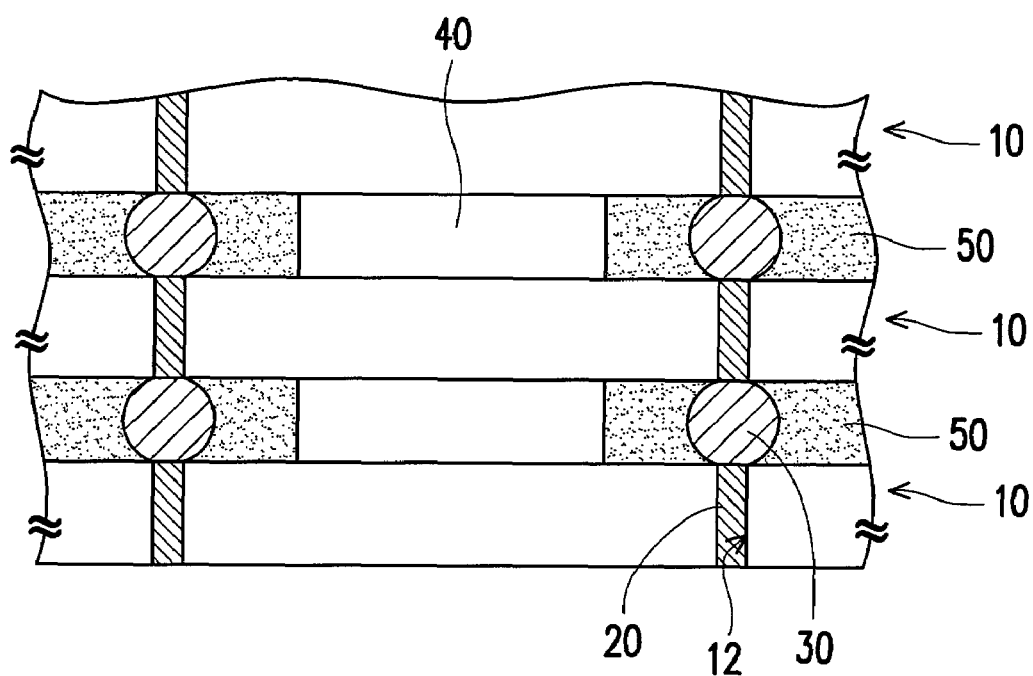
FIG. 1 is a cross-sectional view illustrating a conventional stacked chip structure.
Figure 2A:
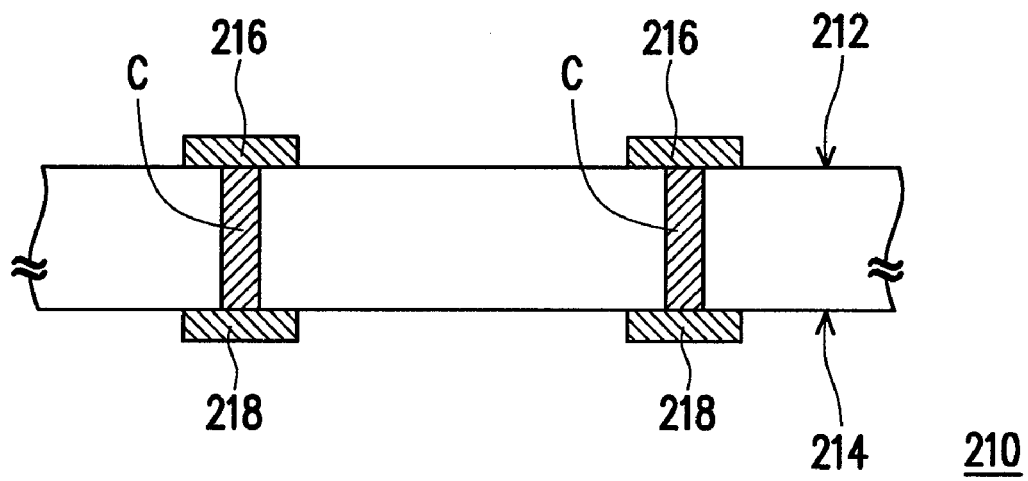
FIGS. 2A through 2H are cross-sectional flowcharts illustrating processes of fabricating a stacked chip structure according to an embodiment of the present invention.
Figure 2B:
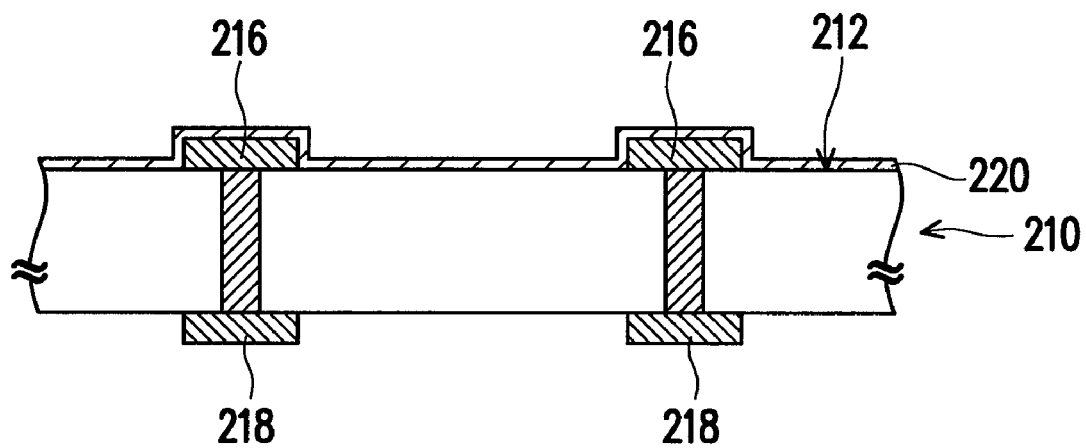
Figure 2C:
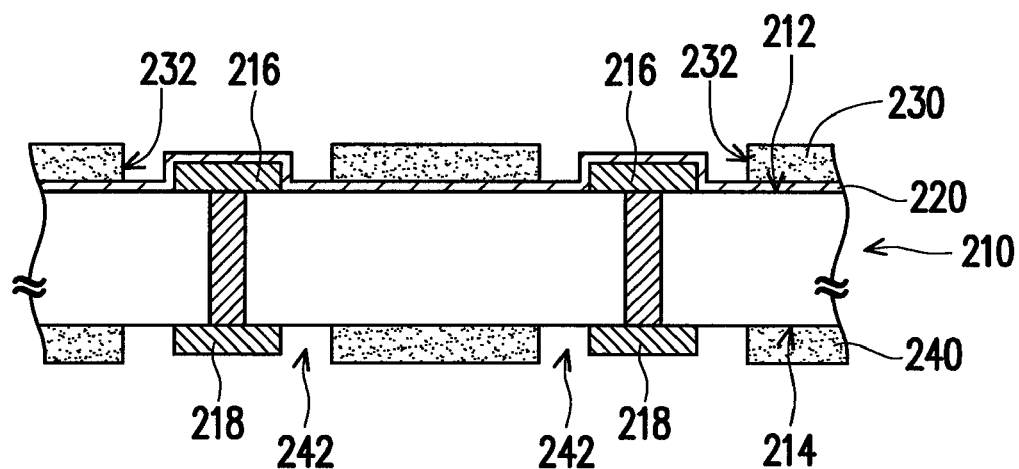
Figure 2D:
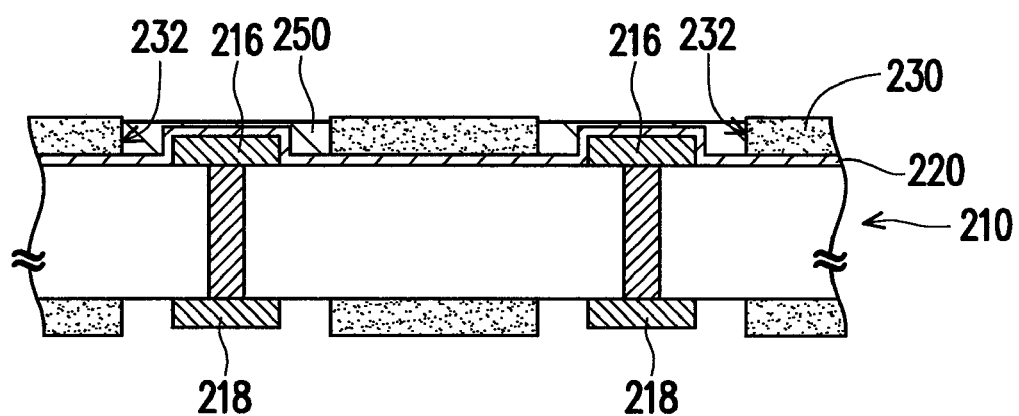
Figure 2E:
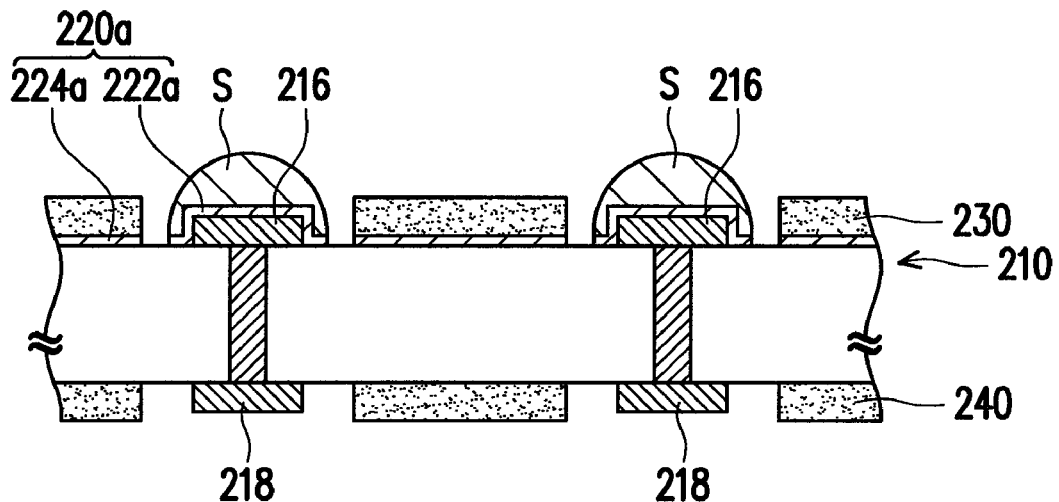
Figure 2F:
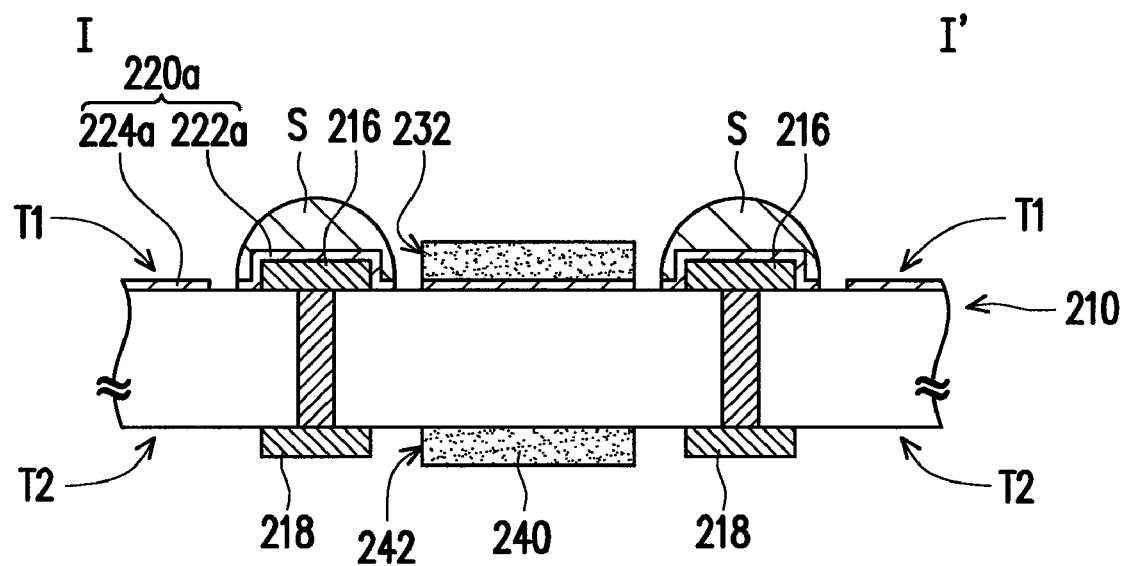
Figure 3:
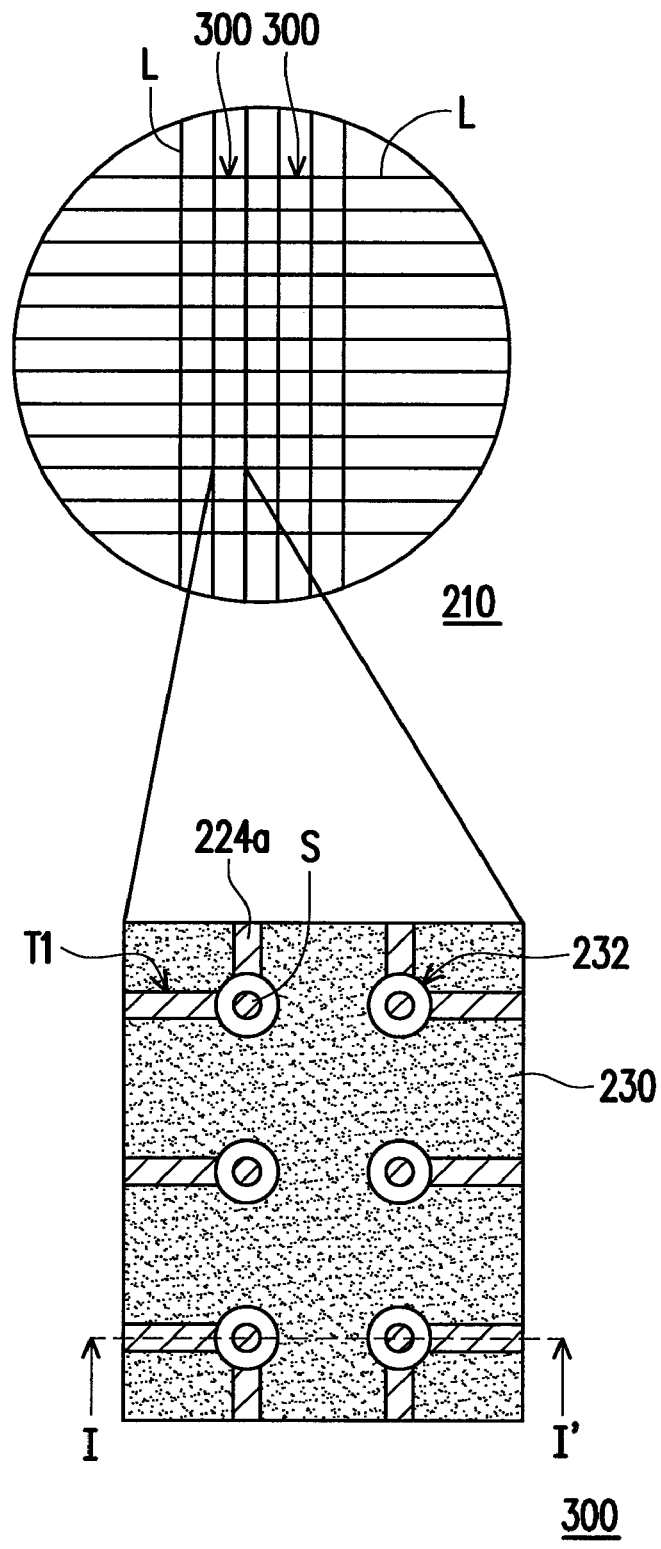

FIG. 3 is a top view of FIG. 2F, while FIG. 2F is a cross-sectional view taken along a sectional line I-I' in FIG. 3.

Firstly, referring to FIG. 2A, a wafer 210 is provided. The wafer 210 has a first surface 212, a second surface 214 opposite to the first surface 212, a plurality of first bonding pads 216 disposed on the first surface 212, a plurality of second bonding pads 218 disposed on the second surface 214, and a plurality of conductive structures C penetrating the first surface 212 and the second surface 214 and electrically connected to the first bonding pads 216 and the second bonding pads 218. Next, referring to FIG. 2B, a first conductive layer 220 is formed on the first surface 212 of the wafer 210 and covers the first bonding pads 216.

Thereafter, referring to FIG. 2C, a first patterned polymer layer 230 is formed on the first conductive layer 220, and the first patterned polymer layer 230 has a plurality of first openings 232 for exposing the first conductive layer 220. Meanwhile, a second patterned polymer layer 240 is formed on the second surface 214, and the second patterned polymer layer 240 has a plurality of second openings 242 for exposing the second bonding pads 218. The method of forming the first patterned polymer layer 230 on the first conductive layer 220 includes forming a first polymer layer (not shown) on the first conductive layer 220 and patterning the first polymer layer (not shown), for example. On the other hand, the method of patterning the first polymer layer includes an exposure and development process or a photolithography and etching process.

Afterwards, referring to FIG. 2D, a second conductive layer 250 is electroplated on the first conductive layer 220 and is also located within the first openings 232. Since the second conductive layer 250 is formed through an implementation of the electroplating process in the present invention, the amount (or the thickness) of the second conductive layer 250 can be precisely controlled, such that a subsequent formation of excessively large solder bumps can be prevented. Moreover, by doing so, the occurrence of circuit shortage can be avoided if the solder bumps are prevented from overflowing onto other bonding pads (now shown) of the wafers when the wafers are stacked. In addition, a material of the second conductive layer 250 is, for example, tin, tin alloy, or other appropriate conductive materials. Next, referring to FIG. 2E, the second conductive layer 250 is heated for forming a plurality of solder bumps S on the first bonding pads 216. In the meantime, a patterned first conductive layer 220a is formed. The patterned first conductive layer 220a has a first portion 222a and a second portion 224a separated from the first portion 222a. The first portion 222a is disposed between the solder bump S and the first bonding pad 216, while the second portion 224a is disposed between the first patterned polymer layer 230 and the wafer 210. The second portion 224a is conducive to heat dissipation of the wafer 210.

In particular, the first conductive layer 220 is patterned when the solder bumps S are formed, and thereby the patterned first conductive layer 220a having the first portion 222a and the second portion 224a separated from each other is further formed. Hence, it is not required to remove the second portion 224a in the present invention. Besides, the method of heating the second conductive layer 250 includes performing a reflow process. In addition, a material of the solder bumps S is, for example, tin, tin alloy, or other appropriate conductive materials.

Moreover, referring to FIGS. 2F and 3 together, the wafer 210 can be divided into a plurality of chip areas 300 by a plurality of precutting lines L. In the present embodiment, the first patterned polymer layer 230 can be further patterned after the formation of the solder bumps S, such that the first patterned polymer layer 230 is equipped with a plurality of first trenches T1. Each of the first trenches T1 is connected to one of the first openings 232 and extended to an edge of the wafer 210. In addition, the method of patterning the first patterned polymer layer 230 includes an exposure and development process or a photolithography and etching process. Note that the previous processes are exemplary, while the present invention is not limited thereby. In other words, the above-mentioned processes can be performed selectively. Namely, it is likely not to form the first trenches T1.

Referring to FIGS. 2F and 3, in the present embodiment, the second patterned polymer layer 240 can be further patterned, such that the second patterned polymer layer 240 can have a plurality of second trenches T2. Each of the second trenches T2 is connected to one of the second openings 242 and extended to an edge of the wafer 210. Note that the previous processes are exemplary, while the present invention is not limited thereby. In other words, the above-mentioned processes can be performed selectively. Namely, it is likely not to form the second trenches T2. As the first trenches T1 and the second trenches T2 are not formed as depicted in FIG. 2E, the wafer 210 can then be bonded to other wafers on a vacuum condition.

Based on the above, air in the trenches T1 and T2 of the patterned polymer layers 230 and 240 in the present invention can be in contact with external atmosphere. Therefore, no air is contained in the stacked wafers 210 when the wafers 210 are bonded together, and it is feasible for the wafers 210 to be bonded together under the atmospheric environment. In comparison with the related art, it is not required for the wafers 210 of the present invention to be bonded together on the vacuum condition, and thereby manufacturing costs can be reduced according to the present invention. It is of certainty that the wafers 210 can still be bonded together on the vacuum condition. As such, the process of bonding the wafers 210 in the present invention is of great tolerance toward different conditions in view of the possibility of bonding the wafers 210 together on the vacuum condition or under the atmospheric environment in accordance with the present invention. In addition, the trenches T1 and T2 are also conducive to dissipating the heat generated when the conductive structures (i.e. the solder bumps S, the first bonding pads 216, and the second bonding pads 218) of the wafers 210 are bonded together or when the subsequently formed stacked chip structure (not shown) is operated. The trenches T1 and T2 can further expose a part of the second portion 224a, and thereby the heat dissipation of the wafer 210 can be achieved through the trenches T1 and T2.

Figure 2G:
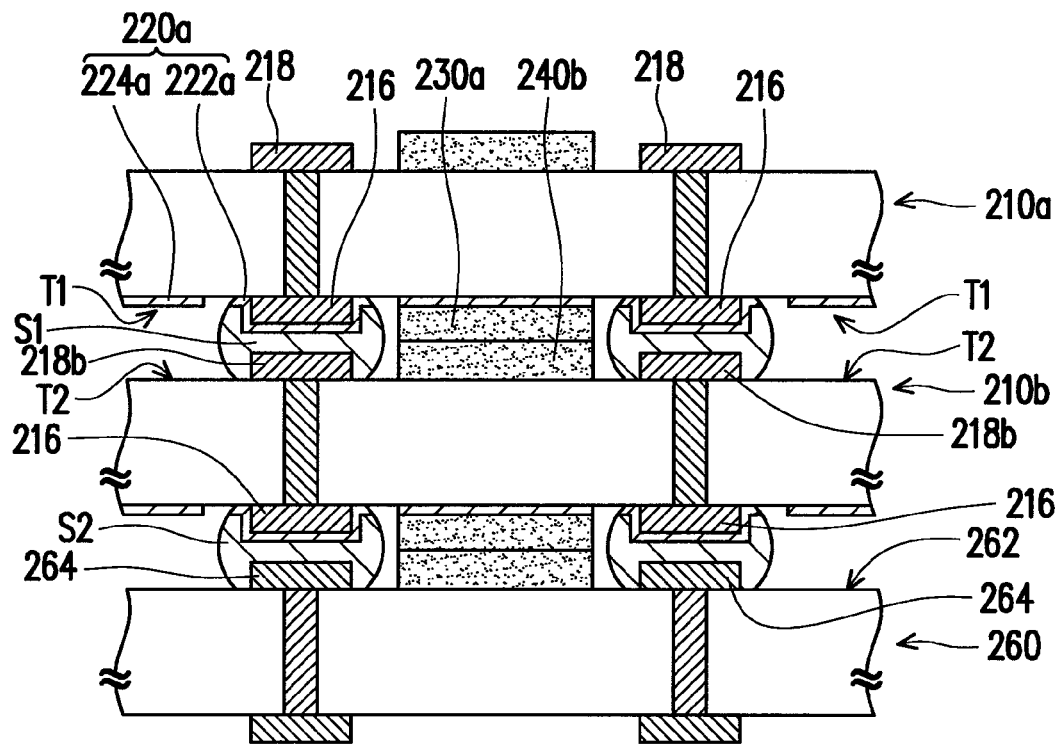

Afterwards, referring to FIG. 2G, a plurality of the wafers 210 is stacked on a substrate structure 260, wherein a first wafer 210a of the wafers 210 is electrically connected to second bonding pads 218b of a second wafer 210b through solder bumps S1. In addition, the first wafer 210a is correspondingly connected to a second patterned polymer layer 240b on the second wafer 210b through a first patterned polymer layer 230a disposed on the first wafer 210a. In FIG. 2G, only two wafers 210a and 210b are illustrated, while the number of the wafers 210 is not limited in the present invention. For example, there can be three, four, five, or more wafers 210 stacked to each other on the substrate structure 260.

Additionally, in the present embodiment, the method of stacking the plurality of wafers 210 on the substrate structure 260 includes stacking the plurality of wafers 210, flipping over the wafers 210, and then disposing the same onto the substrate structure 260. For instance, the second wafer 210b is disposed on the first wafer 210a, and the second bonding pads 218b of the second wafer 210b can be electrically connected to the first bonding pads 216 of the first wafer 210a through the solder bumps SI. Besides, the second patterned polymer layer 240b disposed on the second wafer 210b is correspondingly connected to the first patterned polymer layer 230a on the first wafer 210a. Thereafter, the bonded structure (not shown) constituted by the first wafer 210a and the second wafer 210b is flipped over and disposed on the substrate structure 260.

Moreover, in the present embodiment, the method of stacking the plurality of wafers 210 on the substrate structure 260 further includes flipping over the wafers 210 in sequence and stacking the wafers 210 onto the substrate structure 260. For instance, the second wafer 210b can be firstly flipped over and disposed on the substrate structure 260, and then the first wafer 210a is flipped over and disposed on the second wafer 210b. Here, the first bonding pads 216 of the first wafer 210a can be electrically connected to the second bonding pads 218b of the second wafer 210b. In addition, the first wafer 210a is correspondingly connected to the second patterned polymer layer 240b on the second wafer 210b through the first patterned polymer layer 230a disposed on the first wafer 210a.

In light of the foregoing, the first patterned polymer layer 230a and the second patterned polymer layer 240b are kept in the present invention, such that the first wafer 210a can be correspondingly connected to the second patterned polymer layer 240b on the second wafer 210b through the first patterned polymer layer 230a on the first wafer 210a. As such, it is not necessary to additionally remove the first patterned polymer layer 230a and the second patterned polymer layer 240b in the present invention. Moreover, the bonding strength between the wafers 210a and 210b can be enhanced by means of the patterned polymer layers 230a and 240b, and the reliability of the subsequently formed stacked chip structure can be further improved. Besides, when the first wafer 210a and the second wafer 210b are bonded together, the first patterned polymer layer 230a and the second patterned polymer layer 240b are able to prevent the solder bumps S1 from overflowing onto other bonding pads (not shown). As such, the present invention can be applied to the stacked chip structure in which the chips are bonded by means of the fine-pitch solder bumps.

Figure 2H:
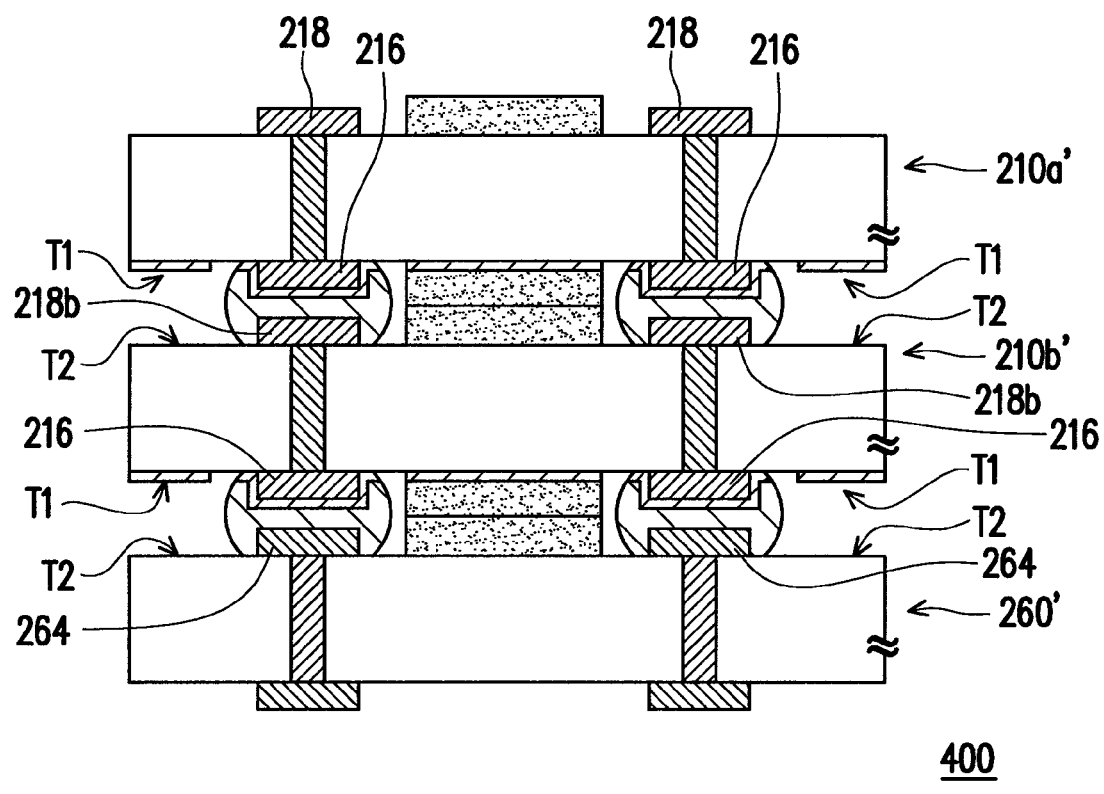

As indicated in FIG. 2G, the substrate structure 260 of the present embodiment can further have a third surface 262 and a plurality of third bonding pads 264 disposed on the third surface 262. The third bonding pads 264 can be electrically connected to the second wafer 210b through solder bumps S2 disposed between the third bonding pads 264 and the second wafer 210b. Thereafter, referring to FIG. 2H, the wafers 210a and 210b and the substrate structure 260 can be cut along the precutting lines L, so as to form a plurality of stacked chip structures 400. Note that only one stacked chip structure 400 is depicted in FIG. 2H, while the number of the stacked chip structure 400 is not limited in the present invention. Besides, the stacked chip structure 400 can be formed by stacking a first chip 210a' and a second chip 210b' on a substrate structure 260'.

To sum up, the patterned polymer layers on the wafers are kept according to the present invention, such that the wafers can be correspondingly connected to each other through the patterned polymer layers on the wafers when the wafers are stacked. Thus, it is not necessary to additionally remove the patterned polymer layers after the plating process in the present invention. Moreover, the bonding strength between the wafers can be enhanced by means of the patterned polymer layers, and the reliability of the stacked chip structure can be further improved. In addition, as the wafers are bonded together, the patterned polymer layers are capable of preventing the heat-softened solder bumps from overflowing onto other bonding pads. As such, the present invention can be applied to the stacked chip structure in which the chips are bonded by means of the fine-pitch solder bumps. Besides, unlike the related art, the present invention does not require filling the space between the wafers with the underfill for increasing the strength and reliability of contacts.

Furthermore, air in the trenches on the patterned polymer layers of the present invention is in contact with external atmosphere. Therefore, no air is contained in the stacked wafers when the wafers are bonded together, and it is feasible for the wafers to be bonded together under the atmospheric environment. In comparison with the related art, it is not required for the wafers of the present invention to be bonded together on the vacuum condition, and thereby manufacturing costs can be reduced according to the present invention. Certainly, the wafers of the present invention can also be bonded together on the vacuum condition. Additionally, the trenches are also conducive to dissipating the heat to the atmosphere. Here, the heat is generated when the conductive structures of the wafers are bonded together or when the stacked chip structure is operated.

Since the second conductive layer is formed through the implementation of the electroplating process in the present invention, the amount (or the thickness) of the second conductive layer can be precisely controlled, such that the subsequent formation of excessively large solder bumps can be prevented. Moreover, by doing so, the circuit shortage can be avoided if the heat-softened solder bumps are prevented from overflowing onto other bonding pads (now shown) when the wafers are stacked in the subsequent processes.

On the other hand, during the fabrication of the stacked chip structure according to the present invention, the second conductive layer is heated for forming a plurality of solder bumps on the first bonding pads. Meanwhile, the patterned first conductive layer is formed. In particular, the first conductive layer is patterned when the solder bumps are formed, and the patterned first conductive layer having the first portion and the second portion separated from each other is further formed. As such, no additional step is required for removing the second portion of the patterned first conductive layer in the present invention. Moreover, the second portion is conducive to heat dissipation of the wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a stacked chip structure, comprising:
    providing a wafer having a first surface, a second surface opposite to the first surface, a plurality of first bonding pads disposed on the first surface, a plurality of second bonding pads disposed on the second surface, and a plurality of conductive structures penetrating the first surface and the second surface and electrically connected to the first bonding pads and the second bonding pads;
    forming a first conductive layer on the first surface of the wafer and covering the first bonding pads with the first conductive layer;
    forming a first patterned polymer layer on the first conductive layer, wherein the first patterned polymer layer has a plurality of first openings for exposing the first conductive layer;
    forming a second patterned polymer layer on the second surface, wherein the second patterned polymer layer has a plurality of second openings for exposing the second bonding pads;
    electroplating a second conductive layer on the first conductive layer, wherein the second conductive layer is located within the first openings;
    heating the second conductive layer for forming a plurality of solder bumps on the first bonding pads and forming a patterned first conductive layer, wherein the patterned firsts conductive layer has a first portion and a second portion separated from the first portion, the first portion is disposed between the solder bump and the first bonding pad, and the second portion is disposed between the first patterned polymer layer and the wafer; and
    stacking a plurality of the wafers on a substrate structure, wherein a first wafer of the wafers is electrically connected to the second bonding pads of a second wafer through the solder bumps, and the first wafer is correspondingly connected to the second patterned polymer layer on the second wafer through the first patterned polymer layer disposed on the first wafer.

2. The fabrication method of the stacked chip structure as claimed in claim 1, wherein a material of the second conductive layer comprises tin or tin alloy.

3. The fabrication method of the stacked chip structure as claimed in claim 1, wherein the method of forming the first patterned polymer layer on the first conductive layer comprises forming a first polymer layer on the first conductive layer and patterning the first polymer layer.

4. The fabrication method of the stacked chip structure as claimed in claim 3, wherein the method of patterning the first polymer layer comprises an exposure and development process or a photolithography and etching process.

5. The fabrication method of the stacked chip structure as claimed in claim 1, further comprising patterning the first patterned polymer layer after the solder bumps are formed, such that the first patterned polymer layer has a plurality of first trenches, and each of the first trenches is connected to one of the first openings and extended to an edge of the wafer.

6. The fabrication method of the stacked chip structure as claimed in claim 5, wherein the method of patterning the first patterned polymer layer comprises a photolithography and etching process or an exposure and development process.

7. The fabrication method of the stacked chip structure as claimed in claim 1, further comprising patterning the second patterned polymer layer after the solder bumps are formed, such that the second patterned polymer layer has a plurality of second trenches, and each of the second trenches is connected to one of the second openings and extended to an edge of the wafer.

8. The fabrication method of the stacked chip structure as claimed in claim 1, wherein the method of heating the second conductive layer comprises performing a reflow process.

9. A stacked chip structure comprising a substrate structure and a plurality of chips stacked on the substrate structure, wherein each of the chips has a first surface and a second surface opposite to the first surface, and each of the chips comprises:
    a plurality of first bonding pads disposed on the first surface;
    a plurality of second bonding pads disposed on the second surface;
    a plurality of conductive structures penetrating the first and the second surfaces and electrically connected to the first bonding pads and the second bonding pads;
    a plurality of solder bumps respectively disposed on the first bonding pads;
    a first patterned polymer layer and a second patterned polymer layer respectively disposed on the first surface and the second surface of the chip, wherein the first patterned polymer layer has a plurality of first openings exposing the solder bumps, and the second patterned polymer layer has a plurality of second openings exposing the second bonding pads; and
    a patterned conductive layer having a first portion and a second portion separated from the first portion, the first portion being disposed between the solder bump and the first bonding pad, the second portion being disposed between the first patterned polymer layer and the chip, wherein a first chip of the chips is electrically connected to the second bonding pads of a second chip through the solder bumps, and the first chip is correspondingly connected to the second patterned polymer layer on the second chip through the first patterned polymer layer disposed on the first chip.

10. The stacked chip structure as claimed in claim 9, wherein a material of the solder bumps comprises tin or tin alloy.

11. The stacked chip structure as claimed in claim 9, wherein the first patterned polymer layer has a plurality of first trenches, and each of the first trenches is connected to one of the first openings and extended to an edge of the chip.

12. The stacked chip structure as claimed in claim 9, wherein the second patterned polymer layer has a plurality of second trenches, and each of the second trenches is connected to one of the second openings and extended to an edge of the chip.

13. The stacked chip structure as claimed in claim 9, wherein the substrate structure has a third surface and a plurality of third bonding pads disposed on the third surface, and the third bonding pads are electrically connected to the second chip through the solder bumps disposed between the third bonding pads and the second chip.

* * * * *